(12) United States Patent
Meisner (10) Patent No.: US 6,225,134 B1
(45) Date of Patent: May 1, 2001

(54) METHOD OF CONTROLLING LINEWIDTH IN PHOTOLITHOGRAPHY SUITABLE FOR USE IN FABRICATING INTEGRATED CIRCUITS

(75) Inventor: Stephen A. Meisner, St. Cloud, FL (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/182,934

(22) Filed: Oct. 30, 1998

(51) Int. Cl.$^7$ ................................................. H01L 21/00
(52) U.S. Cl. .................. 438/7; 438/16; 438/17; 438/725; 438/780
(58) Field of Search .................... 438/7, 17, 16, 438/780, 725

(56) References Cited

U.S. PATENT DOCUMENTS

| | | | |
|---|---|---|---|
| 5,124,927 | * 6/1992 | Hopewell et al. | 364/468 |
| 5,363,171 | * 11/1994 | Mack | 355/68 |
| 5,485,080 | 1/1996 | Larrabee et al. . | |
| 5,739,909 | 4/1998 | Blayo et al. . | |
| 5,776,640 | 7/1998 | Bae . | |
| 5,780,316 | 7/1998 | Chew et al. . | |
| 5,837,428 | * 11/1998 | Huang et al. | 430/313 |
| 5,926,690 | * 7/1999 | Toprac et al. | 438/17 |
| 6,043,496 | * 3/2000 | Tennant | 250/492.1 |

* cited by examiner

*Primary Examiner*—Richard Elms
*Assistant Examiner*—Pho Luu
(74) *Attorney, Agent, or Firm*—Alston & Bird LLP (57) ABSTRACT

A method for controlling linewidth in photolithography and in particular during the fabrication of integrated circuits involves separately introducing a linewidth control feature onto a substrate or wafer. This linewidth control feature is preferably introduced after the desired design features or codes and is introduced using the same photomask or reticle as the desired design features. This photomask preferably includes the linewidth control feature at a point outside the maximum field zone as well as a masked pad portion that is in the maximum field zone. This masked pad portion is introduced with the desired design features and serves as a location for subsequent exposure of the linewidth control features. The method allows for the variation in linewidth introduced by the lens to be minimized, or even eliminated, since the same portion of the lens field can be used to expose each linewidth control feature.

31 Claims, 6 Drawing Sheets

METHOD OF CONTROLLING LINEWIDTH IN PHOTOLITHOGRAPHY SUITABLE FOR USE IN FABRICATING INTEGRATED CIRCUITS

FIELD OF THE INVENTION

The invention relates to a method for photolithography and, in particular a method for controlling the width of a feature, referred to as linewidth, which is introduced onto a substrate by the photolithography process. The invention further relates to a method for fabricating integrated circuits including the use of non-code dependent linewidth control features for controlling linewidth characteristics.

BACKGROUND OF THE INVENTION

Photolithography involves the controlled exposure of a photoresist layer on a substrate to provide a desired design on the substrate. In photolithography, a photomask, which can be a positive or negative of the desired design, is first aligned with the substrate. A photoactive material on the substrate is then exposed using a suitable source of radiation, e.g., visible light or UV radiation.

Photolithography is widely used in the fabrication of integrated circuits. Because the fabrication of integrated circuits typically involves the sequential use of more than one photomask, the proper alignment of the photomask with the wafer and the formation of the designed image on the wafer becomes particularly critical. One device that has been used to align and image photomasks is a stepper. The stepper has found widespread use in light of recent advances in the field of integrated circuits that have resulted in a significant decrease in the size of design features.

In the fabrication of integrated circuits, the linewidth of etched design features are measured and monitored to detect process irregularities that can ultimately lead to degraded circuit performance.

It has been discovered that in the field of photolithography, and in particular, those photolithographic processes that employ a stepper to align and image the reticle (or photomask) onto the wafer, a number of factors associated with the exposure of the wafer can introduce linewidth variation. For example, the devices employed, such as the stepper, the reticle and even the stepper lens, can introduce variations in the linewidth of design elements exposed on a wafer.

Linewidth variation can also be introduced by the process characteristics of other steps in the photolithographic process and in particular, those steps involving the application of the photoresist. Examples of such process characteristics include the photoresist reflectivity, photoresist thickness, as well as the characteristics of the process used to apply and/or develop the photoresist.

One attempt to effectively control linewidth variation has involved the use of linewidth control features (LCF), which are in effect test patterns, introduced onto a wafer. A variety of linewidth control features are known in the art. See, for example, U.S. Pat. No. 5,780,316, which is incorporated by reference in its entirety for all purposes.

During a typical integrated circuit manufacturing process, transistors known as gates are being formed within individual integrated circuits. LCF's, which are additional features having the same width and material composition as the gates, are formed on the individual integrated circuits together with the gates. The linewidth control features may be subsequently examined and measured by, for example, scanning electron microscopy (SEM), to determine whether the gate forming process, in particular the gate width, has been performed properly. If, upon examination, the linewidth control features appear to have the proper width, it is inferred that the gates of individual integrated circuits (which were formed at the same time and by the same process as the linewidth control feature) have been properly formed. Alternatively, the linewidth control features can be electrically tested so as to detect irregularities in linewidth. This allows for the determination of electrical performance which is not directly obtainable from features in the integrated circuit.

However, it has now been discovered that the typical way in which linewidth control features are introduced on the wafer introduces its own set of limitations and/or difficulties. One particular problem relates to the fact that printed fields can vary greatly. For example, each code used in forming an integrated circuit can employ different field and chip sizes as well as different grid locations. Because of this, the location of the linewidth control features within the stepper lens field will vary from one code to another. The LCF's associated with these codes are, therefore, exposed using different portions of the lens field. Accordingly, the linewidth characteristics of the linewidth control features themselves can vary from one code to another due to the variation across the stepper lens field.

Figure 1A:
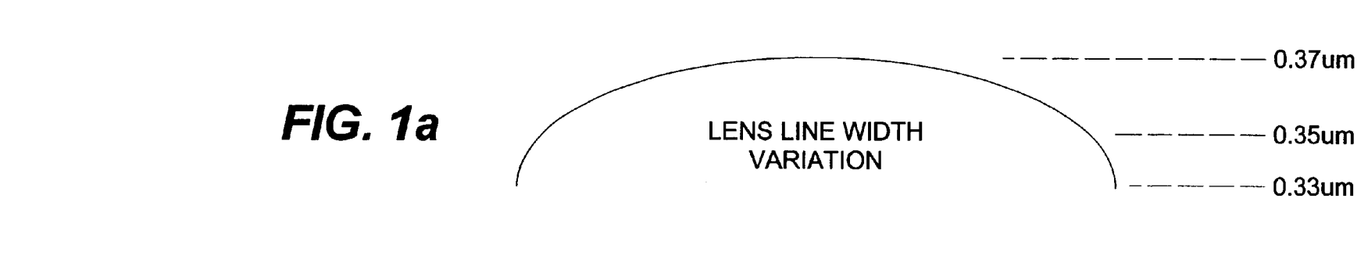
FIG. 1 schematically illustrates a problem associated with the exposure of traditional linewidth control features.
Figure 1B:
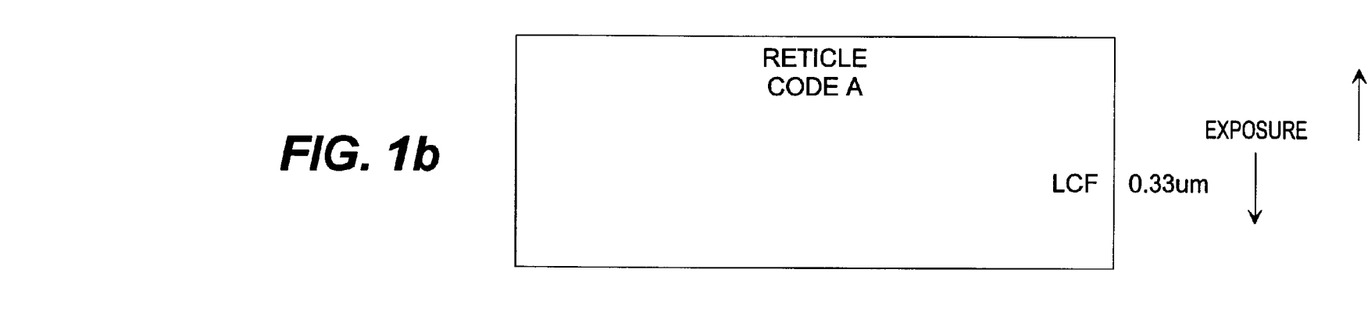
Figure 1C:
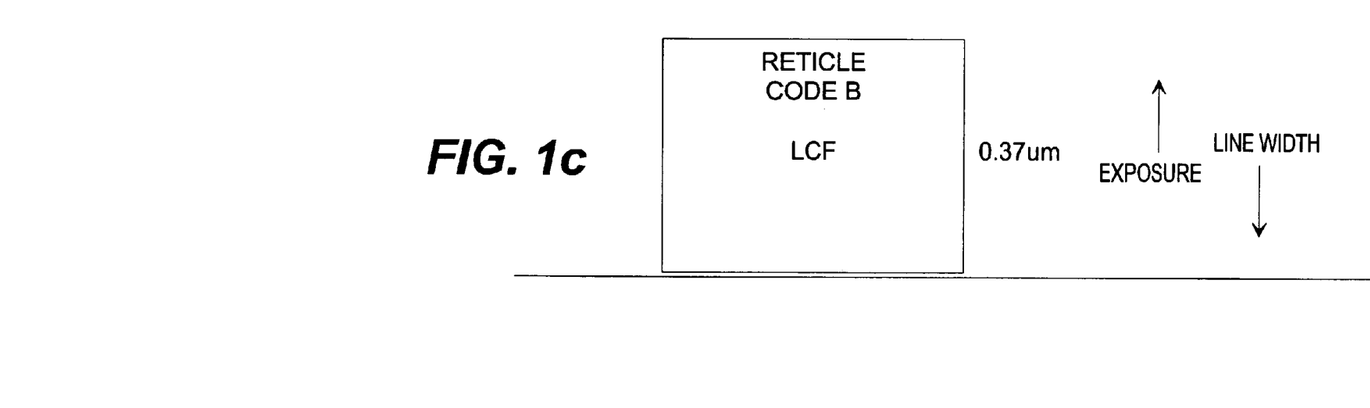

This problem, as discovered by the inventor, can be illustrated, e.g., by FIGS. 1a–c. FIG. 1a illustrates that even well manufactured lens can have minor variations that can lead to linewidth discrepancies of 10% or more. For example, the LCF used in connection with Code A (FIG. 1b), because of its placement near the "edge" of the lens will differ in linewidth from the LCF of Code B (FIG. 1c) which is generally exposed using the "mid-section" of the lens. This is true even if the LCF's for Code A and B have the same size and shape on the reticle.

Lens-induced variation not only impacts on the linewidth of the feature itself, but also can adversely impact subsequent exposure steps. That is, because the linewidth control feature is used to optimize exposure energy, the variation in the linewidth control feature caused by the lens field can result in erroneous adjustments in exposure energy. This, in turn, will introduce variations into the linewidth across a wafer.

This problem, which has only been discovered by the inventor, necessitates an improved process for linewidth control, particularly in a photolithography stepper environment used in fabricating integrated circuits.

SUMMARY OF THE INVENTION

The invention is based at least in part on the surprising discovery that separating the exposure step for a linewidth control feature onto a wafer from the exposure step for the related circuit design features can substantially, if not completely, eliminate the variation in linewidth caused by the gradation across a stepper lens field. Accordingly, a consistent LCF can be provided at multiple locations on a wafer and thus, more effective control of linewidth in the resulting integrated circuit can be provided.

A first aspect of the invention relates to a method for introducing a linewidth control feature onto a substrate during photolithography. The process employs a photomask having a field zone with (i) a linewidth control feature located outside of the zone and (ii) a masked pad portion in the field zone. A substrate is first exposed so as to provide at least one unexposed portion on the substrate corresponding to the masked pad portion of the photomask. The substrate is then exposed using the photomask so that the control feature is exposed onto one or more unexposed portions of the substrate.

Another aspect of the invention involves a method for controlling linewidth during photolithography that further includes testing of the linewidth control features so as to be able to determine linewidth characteristics of design features that are also present on the substrate. This testing of the linewidth control feature(s) can involve, e.g., scanning electron microscopy and/or electrical testing of the control feature(s). This aspect of the invention can further include adjusting exposure energy based upon the results of the testing of the linewidth control features.

The invention also relates to a photolithography process that employs the inventive linewidth control method. Yet another aspect of the invention relates to a method for fabricating integrated circuits using this linewidth control technique. In particular, the method involves the use of a photomask that allows the separate exposure of design features and linewidth control features on a wafer.

Other aspects of the invention include the reticles or photomasks that can be employed in the inventive method as well as a test mask for calibrating the linewidth control feature.

These and other aspects will be apparent from the description and claims that follow.

DETAILED DESCRIPTION OF THE PREFERRED EMBODIMENT

As discussed above, a primary aspect of the invention includes an improved process for controlling linewidth across the surface of a substrate to be exposed by photolithography.

To this end, the process of the invention relates to a method for introducing one or more line control features onto a substrate where the linewidth control feature exposure step is separate from, and subsequent to, the exposure of desired design elements onto the substrate. The linewidth control feature is preferably exposed using the same photomask as the desired design feature. Moreover, the process preferably provides for the same portion of the lens field in exposing each line control feature on the wafer. This allows improved consistency in the resulting linewidth control features and can eliminate variation in linewidth control features introduced by, e.g., lens variation.

This process can be employed with any photolithographic process recognized in the art including Poly Gate, Metal, and Contact Hole photolithographic processes. Moreover, the inventive method can be employed with any photoresist, and utilize any type of radiation recognized in lithographic art for exposing the photoresist. These forms of radiation include visible light, UV, or electron beam radiation. The process can further employ any art-recognized alignment device such as a stepper or a step and scan system. Where a stepper is used in photolithography, this process can be employed by any stepper recognized in the art such as those produced by Nikon, Cannon, and ASML. This process can further be employed using any substrate suitable for use in connection with photolithography. In the field of integrated circuits, silicon wafers are preferred. However, other semiconductors recognized in the art such as germanium silicon can be used.

Figure 2:
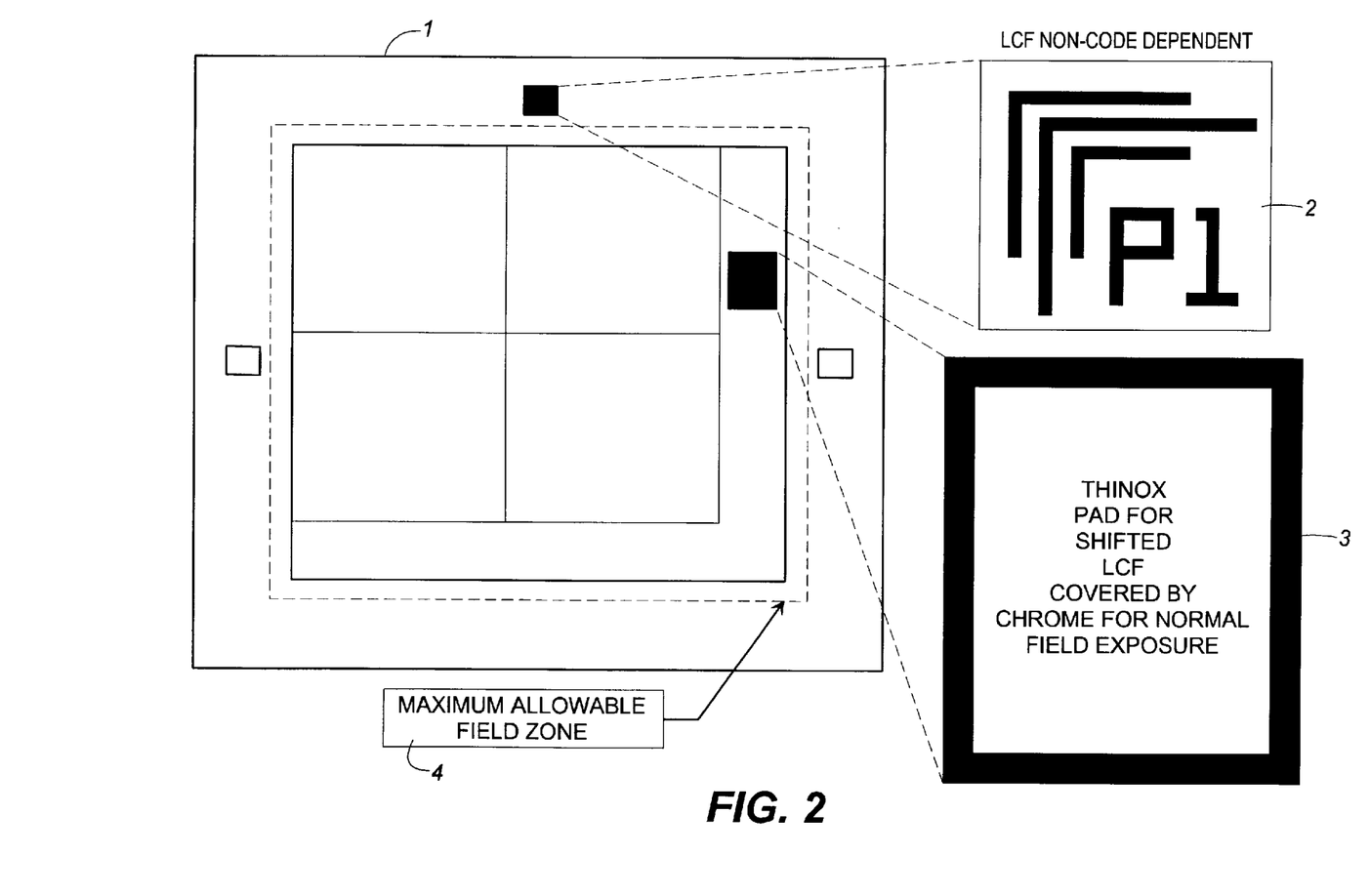
FIG. 2 illustrates a photomask according to the present invention.

This process is also independent of the features being exposed directly or indirectly onto the wafer. To that end, it can be employed to introduce any desired design onto a substrate, but finds particular usefulness in the fabrication of integrated circuit codes. Similarly, the shape or design of the LCF is not critical to the invention. The choice of a particular design for the LCF is dependent upon the particular design feature, and within the scope of those skilled in the art. Examples of a suitable test masks are shown in FIG. 2 as well as U.S. Pat. No. 5,780,316.

The invention will now be discussed in terms of one preferred example thereof; the fabrication of integrated circuits employing a stepper. While this invention embodiment of the invention is preferred, the method can be employed with any photolithographic process, as discussed above.

In this embodiment, a photomask or reticle that includes a linewidth control feature is used to provide the desired design on the wafer. The linewidth control feature is located at a position outside of the exposed field zone of the photomask, preferably outside the maximum allowable field zone. An example of a photoresist arrangement is illustrated by FIG. 2.

As can be seen from FIG. 2, the reticle or photomask 1 includes linewidth control feature 2 and masked pad portion 3. Moreover, the linewidth control feature is outside field zone portion of the photomask to be exposed (generally designated at 4) while the pad portion that is masked with, for example, a suitable element such as chrome, is located inside the zone 4. In order to better prevent the linewidth control feature from being exposed, it can be located outside the maximum allowable field zone of the photomask. Because the pad portion 3 is masked, upon exposure, it provides a corresponding unexposed portion on the wafer.

The photomask or reticles employed in the inventive method can be made by techniques recognized in the art and as such need not be described in detail here.

Figure 3:
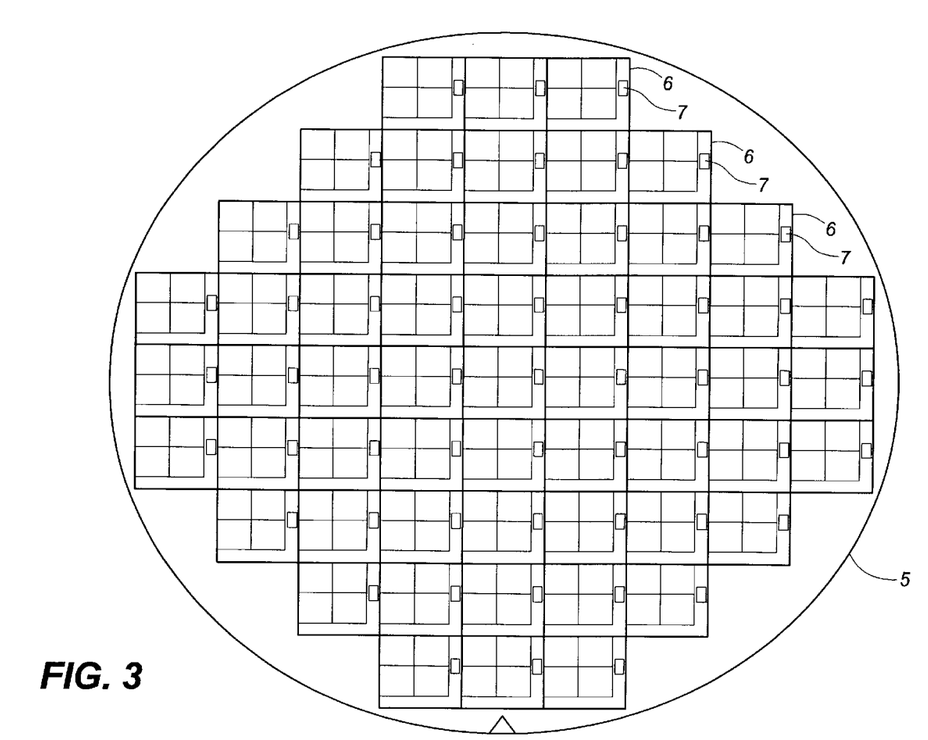
FIGS. 3–5 illustrate an example of a linewidth control technique of the present invention.

In this embodiment, the first step of the process involves exposing a wafer so that each of the exposed fields includes an unexposed pad portion. Because the linewidth control feature is located outside of the field zone to be exposed, it is not exposed onto the wafer or substrate in this step. An example of a wafer exposed in this manner is illustrated in FIG. 3. The wafer 5 includes a number of fields 6 exposed directly or indirectly on substrate, each field including an unexposed portion 7. The unexposed portions 7 of the wafer 5 serve as a "location" for the linewidth control feature which are subsequently exposed directly or indirectly on the substrate.

As discussed above, any photolithographic techniques for exposing a photomask can be used, although the use of a stepper is preferred.

Figure 4:
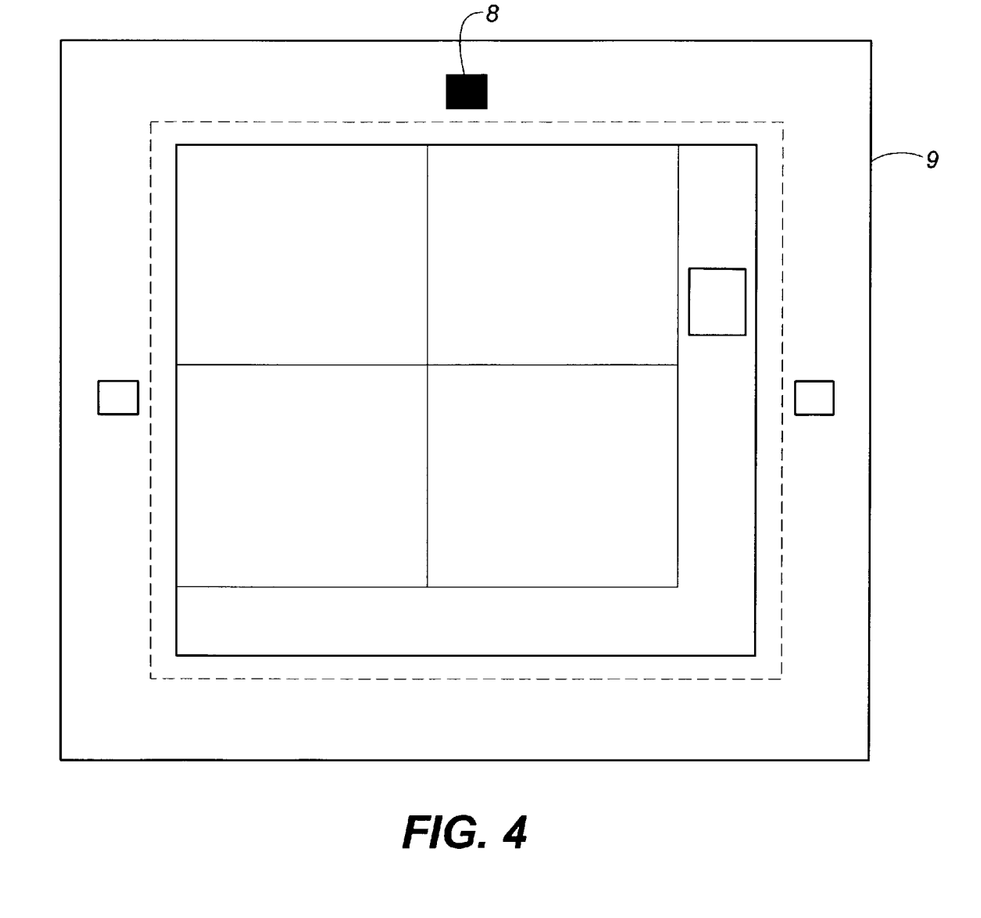

The next step of the process involves exposing only the linewidth control feature portion of the photomask or reticle so as to introduce the LCF onto the wafer. This can be done in the stepper environment, for example, by blinding down the reticle, 9, so as to focus solely upon the linewidth control feature, 8. Such a blinding step is illustrated by FIG. 4. The linewidth control feature is then introduced onto one or more of the unexposed pad portions on the substrate.

Figure 5:
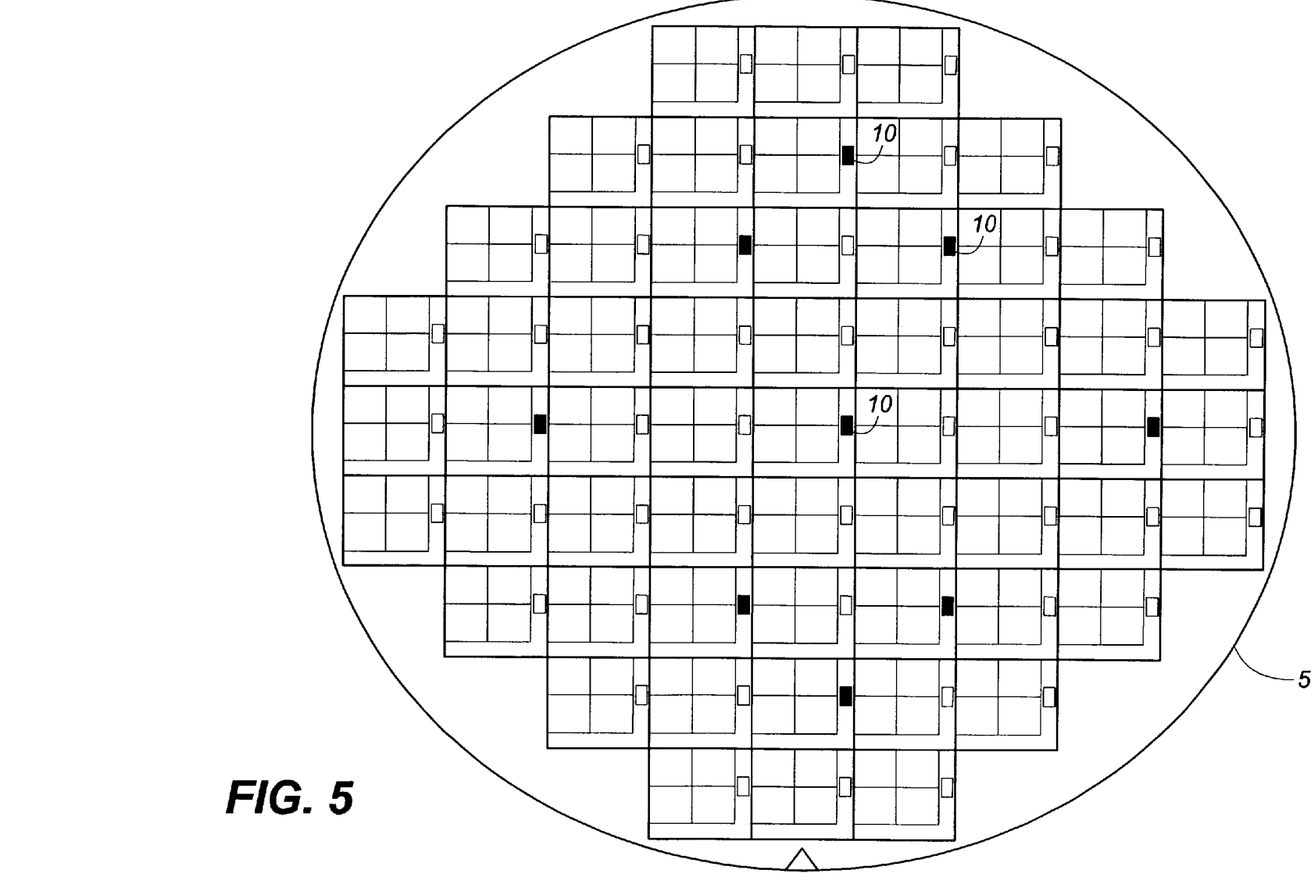

Since this LCF exposure step is separate from, and subsequent to, exposing the design features themselves, it does influence the overall speed and cost of the photolithography process. Thus, it is preferred to minimize the number of sites onto which the linewidth control feature is ultimately exposed. An example of a wafer in which the linewidth control feature has been exposed thereon is illustrated by FIG. 5. To this end, the LCF is exposed on at least one unexposed portion of the wafer. The precise number of LCF's, of course, is only limited by the number of exposure fields on the wafer; however, a typical number of LCF's, 10, to be exposed on the wafer, 5, will range from 5–20.

The sequence of steps for separately introducing the linewidth control feature(s) onto the wafer can be either manually performed or can be automatically controlled by the software associated with the stepper. For example, suitable stepper software is commercially available from companies such as Nikon and Cannon.

The sequence of exposure steps can then be repeated one or more times where more than one reticle is used in the fabrication process.

After exposure, the linewidth control feature can be tested by techniques recognized in the art. The particular technique is not critical to the invention. Suitable techniques include optical, SEM, and electrical techniques for testing linewidth. Because these techniques are well recognized in the art, they need not be described in detail here.

Subsequent to testing, suitable remedial measures can be taken; e.g., the exposure step can be adjusted as with traditional linewidth control techniques. The most common example of a specific remedial step involves adjusting the exposure energy depending upon the results obtained from testing of the linewidth control feature. Other remedial measures can include changes in the photoresist apply and development processes.

This technique for linewidth control can provide many advantages over that typically employed in the art. A first advantage relates to the ability to provide a more accurate "calibration" of the linewidth control feature, i.e., a consistent correlation between a feature of the LCF and a feature of a particular element at a specific location on the wafer.

Figure 6:
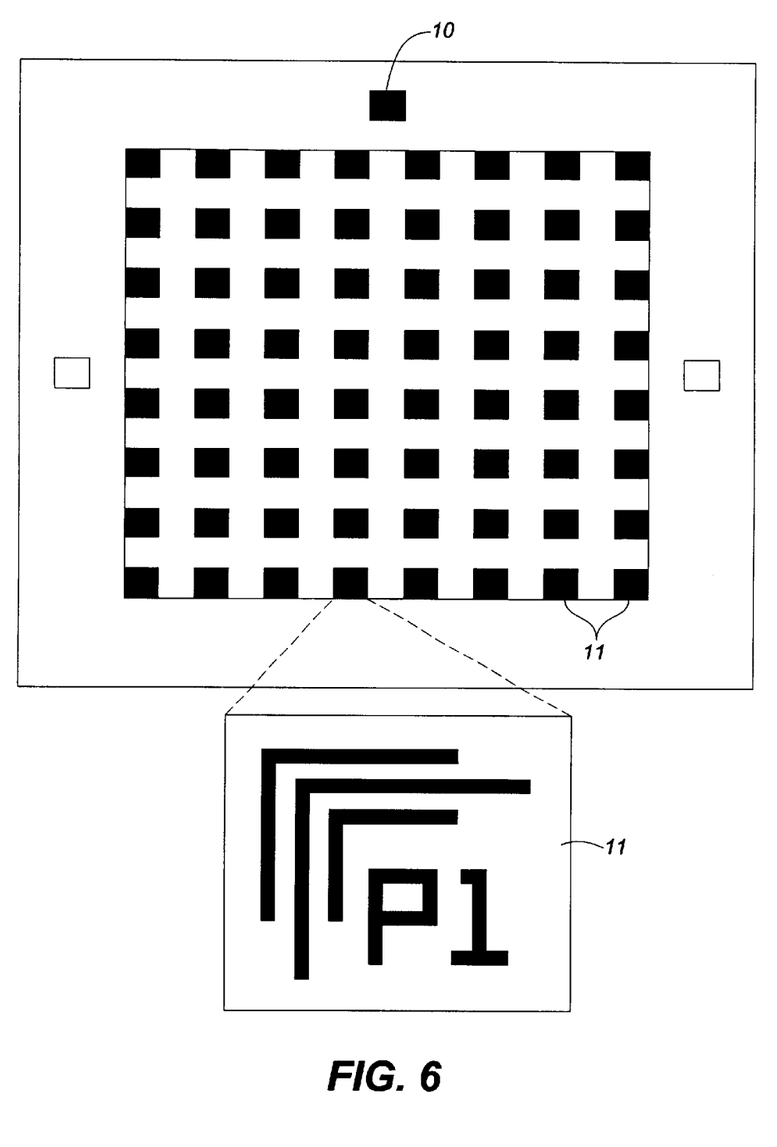
FIG. 6 illustrates a test mask or reticle for calibrating the linewidth control technique.

To this end, a test mask or reticle, such as that illustrated in FIG. 6 can be provided. The test reticle shown in FIG. 6 includes a linewidth control feature 10 outside of the maximum field 4 and a number of LCF features 11 within the maximum field 4. Upon exposure of a wafer by the inventive method the LCF 10 can be compared to the characteristics of linewidth control features at any point across the field zone. Since the linewidth control feature will be substantially, if not completely, unaffected by lens variation, a more accurate comparison between the linewidth control feature and any design feature present at a particular location in the field zone can be provided.

Second, since the linewidth control feature is consistently placed from photomask to photomask and is independent of lens variation, it can serve to minimize or eliminate many of the exposure-based factors that contribute to the linewidth variation. Those factors that remain are attributable to the process characteristics surrounding the photoresist layer and, as such, can be more effectively studied.

While the present invention has been described in certain preferred embodiments thereof, it will be apparent that various substitution, omissions, modifications, and other changes which may be made without departing from the spirit of the invention. For example, while the specification has focused on the use of photolithography in connection with integrated circuits, the invention is in no way limited to that environment. Thus, the present invention should be limited only by the scope of the following claims including equivalents thereof.

What is claimed is:

1. A method for introducing a linewidth control feature onto a substrate during photolithography comprises:
   (a) providing a photomask having a field zone portion to be exposed with (i) a linewidth control feature located outside the field zone, and (ii) a masked pad portion located inside the field zone;
   (b) exposing a substrate using the photomask so as to provide at least one unexposed portion of the substrate corresponding to the masked pad portion of the photomask;
   (c) exposing the substrate, after completion of the initial exposure process of (b), using the photomask such that the linewidth control feature is exposed on one or more of the unexposed portions of the substrate resulting from (b).

2. The method according to claim 1 wherein steps (a) and (b) involve the use of visible light, UV, or electron beam radiation.

3. The method according to claim 1 wherein the linewidth control feature is located outside the maximum allowable field zone.

4. A method for controlling linewidth during photolithography comprises:
   (a) exposing one or more design features on a substrate using a photomask;
   (b) exposing after completion of the initial exposure process of (a), one or more linewidth control features on an unexposed portion of the substrate using the same photomask as in step (a); and
   (c) testing the linewidth characteristic of the linewidth control feature(s).

5. The method according to claim 4 wherein steps (a) and (b) involve the use of a stepper.

6. The method according to claim 4 wherein steps (a) and (b) involve the use of a lens and each linewidth control feature is exposed using substantially the same portion of the lens field.

7. The method according to claim 4 wherein the photomask has a field zone and includes (i) a linewidth control feature located outside the field zone and (ii) a masked pad portion in the maximum field zone.

8. The method according to claim 4 wherein step (c) comprises electrically testing the linewidth control feature.

9. The method according to claim 4 wherein step (c) comprises optically testing the linewidth control feature.

10. The method according to claim 4 further comprising (d) adjusting exposure energy based upon the results of the testing of step (c).

11. A method for controlling linewidth during fabrication of an integrated circuit comprises:
    (a) exposing a device for an integrated circuit on a wafer; and
    (b) exposing a linewidth control feature on the wafer in an exposure step separate from step (a), wherein steps (a) and (b) are performed using the same photomask.

12. The method according to claim 11 wherein steps (a) and (b) involve the use of a stepper.

13. The method according to claim 12 wherein steps (a) and (b) employ a photomask in which the linewidth control feature is located outside a field zone of the reticle.

14. The method according to claim 12 wherein steps (a) includes exposing the device at more than one location on the wafer.

15. The method according to claim 14 wherein step (b) includes exposing more than one linewidth control feature on the wafer.

16. The method according to claim 15 wherein steps (a) and (b) utilize a lens, and step (b) is performed using substantively the same portion of the lens for exposing each line control feature.

17. The method according to claim 11 further comprising, after step (b):
(c) testing the linewidth characteristics of the linewidth control features.

18. The method according to claim 17 further comprising, after step (c), (d) adjusting exposure energy based on results from the testing of step (c).

19. The method according to claim 11 wherein steps (a) and (b) are repeated one or more times using other photomasks.

20. A photolithography process comprises:
(a) exposing a substrate using a photomask including one or more design features, one or more masked pad portions and one or more linewidth control features to provide substrate having (i) one or more design features and (ii) one or more unexposed portions while substrate does not include any linewidth control features; and
(b) exposing the substrate, after completion of the initial exposure process of (a), using the photomask of (a) so as to provide one or more linewidth control features on at least one of the unexposed portions of the substrate.

21. The method according to claim 20 wherein steps (a) and (b) involve exposure using visible light, UV, or electron beam radiation exposure.

22. A method for fabricating integrated circuits using photolithography, comprises:
(a) exposing a wafer using a photomask so as to (i) introduce one or more design features onto a wafer, and (ii) one or more unexposed portions of the wafer; and
(b) exposing the wafer using a photomask to provide linewidth control features on at least one of the unexposed portions, wherein (a) and (b) are performed using the same photomask.

23. The method according to claim 22 wherein steps (a) and (b) involve the use of a stepper.

24. The method according to claim 22 wherein the number of linewidth control features exposed on the wafer is less than the number of unexposed pad portions.

25. A method of improvement for fabricating an integrated circuit including the step of exposing a wafer using a stepper, wherein the improvement comprises the use of a photomask that includes:
(a) a linewidth control feature which is located outside a field zone of the photomask; and
(b) a masked pad portion in the field zone wherein the masked pad portion defines the location of the linewidth control feature on the wafer subsequent to a second exposure process.

26. The method according to claim 25 wherein the linewidth control feature is located outside of the maximum allowable field zone of the photomask.

27. A photomask having a field zone defined therein comprising:
(a) a linewidth control feature located outside the field zone; and
(b) at least one masked pad portion defined in the field zone.

28. The photomask according to claim 27 further comprising (c) at least one design feature suitable for use in an integrated circuit.

29. The photomask according to claim 27 wherein the linewidth control feature is located outside the maximum allowable field zone of the photomask.

30. A test mask for use in photolithography having a field zone and comprises:
(a) a linewidth control feature located outside the field zone; and
(b) a plurality of linewidth control features located in the field zone.

31. The test mask according to claim 30 wherein the linewidth control feature (a) is located outside the maximum allowable field zone.

* * * * *